(12) United States Patent
Dubertret et al.

(10) Patent No.: US 12,399,309 B2
(45) Date of Patent: Aug. 26, 2025

(54) BLUE FILTER FOR DISPLAY

(71) Applicant: NEXDOT, Romainville (FR)

(72) Inventors: Benoît Dubertret, Romainville (FR);
Guillaume Naudin, Romainville (FR);
Michele D'Amico, Romainville (FR);
Wilfried Solo-Ojo, Romainville (FR);
Yu-Pu Lin, Romainville (FR)

(73) Assignee: NEXDOT, Romainville (FR)

( * ) Notice: Subject to any disclaimer, the term of this patent is extended or adjusted under 35 U.S.C. 154(b) by 361 days.

(21) Appl. No.: 17/800,147

(22) PCT Filed: Feb. 19, 2021

(86) PCT No.: PCT/EP2021/054192
§ 371 (c)(1),
(2) Date: Aug. 16, 2022

(87) PCT Pub. No.: WO2021/165486
PCT Pub. Date: Aug. 26, 2021

(65) Prior Publication Data
US 2023/0082669 A1  Mar. 16, 2023

(30) Foreign Application Priority Data
Feb. 21, 2020  (EP) .................................. 20305171

(51) Int. Cl.
*G02B 5/20* (2006.01)
*B65D 23/08* (2006.01)
(Continued)

(52) U.S. Cl.
CPC ......... *G02B 5/206* (2013.01); *B65D 23/0821* (2013.01); *B65D 81/30* (2013.01);
(Continued)

(58) Field of Classification Search
CPC .......................... G02B 5/207; G02F 1/133514
See application file for complete search history.

(56) References Cited

U.S. PATENT DOCUMENTS

2013/0063683 A1* 3/2013 Lin .................... G02F 1/133514
349/68
2017/0090244 A1* 3/2017 Jiang ................. H01L 29/78633
2019/0219751 A1* 7/2019 Barrett .................. G02F 1/1335

FOREIGN PATENT DOCUMENTS

CN  104993037 B  1/2018
JP  2003155415 A *  5/2003

OTHER PUBLICATIONS

International Search Report and Written Opinion issued on May 18, 2021, in connection with corresponding International Patent Application No. PCT/EP2021/054192; 9 pages.

* cited by examiner

Primary Examiner — Paisley L Wilson
(74) *Attorney, Agent, or Firm* — Maier & Maier, PLLC

(57) ABSTRACT

A display that includes an image producing system and a light filtering layer in the blue range, the light filtering layer having a limited impact on the gamut of the display. The image producing system has a gamut $G_0$ defined in a color space The light filtering layer includes semi-conductive nanoparticles, and the absorbance through the light filtering layer is greater than 0.25 for each light wavelength ranging from 350 nm to $\lambda_{cut}$, $\lambda_{cut}$ being in the range from 420 nm to 450 nm. The gamut $G_1$ of the image producing system with the filtering layer has an area greater than 90% of the area of gamut $G_0$ in the color space.

14 Claims, 6 Drawing Sheets

(51) Int. Cl.

| | |
|---|---|
| *B65D 81/30* | (2006.01) |
| *B65D 85/72* | (2006.01) |
| *C03C 17/00* | (2006.01) |
| *C08F 18/24* | (2006.01) |
| *C08F 20/28* | (2006.01) |
| *C08G 77/18* | (2006.01) |
| *C08K 9/02* | (2006.01) |
| *C08K 9/04* | (2006.01) |
| *G02B 1/04* | (2006.01) |
| *G02F 1/1335* | (2006.01) |
| *H10H 29/85* | (2025.01) |

(52) U.S. Cl.
CPC ............ *B65D 85/72* (2013.01); *C03C 17/005* (2013.01); *C03C 17/009* (2013.01); *C08F 18/24* (2013.01); *C08F 20/28* (2013.01); *C08G 77/18* (2013.01); *C08K 9/02* (2013.01); *C08K 9/04* (2013.01); *G02B 1/04* (2013.01); *G02B 1/041* (2013.01); *G02B 5/207* (2013.01); *G02B 5/208* (2013.01); *G02F 1/133514* (2013.01); *H10H 29/8517* (2025.01); *C03C 2217/445* (2013.01); *C03C 2217/475* (2013.01); *C03C 2217/48* (2013.01); *C03C 2218/113* (2013.01); *C08F 2800/10* (2013.01); *C08K 2201/001* (2013.01); *C08K 2201/011* (2013.01); *G02B 2207/101* (2013.01)

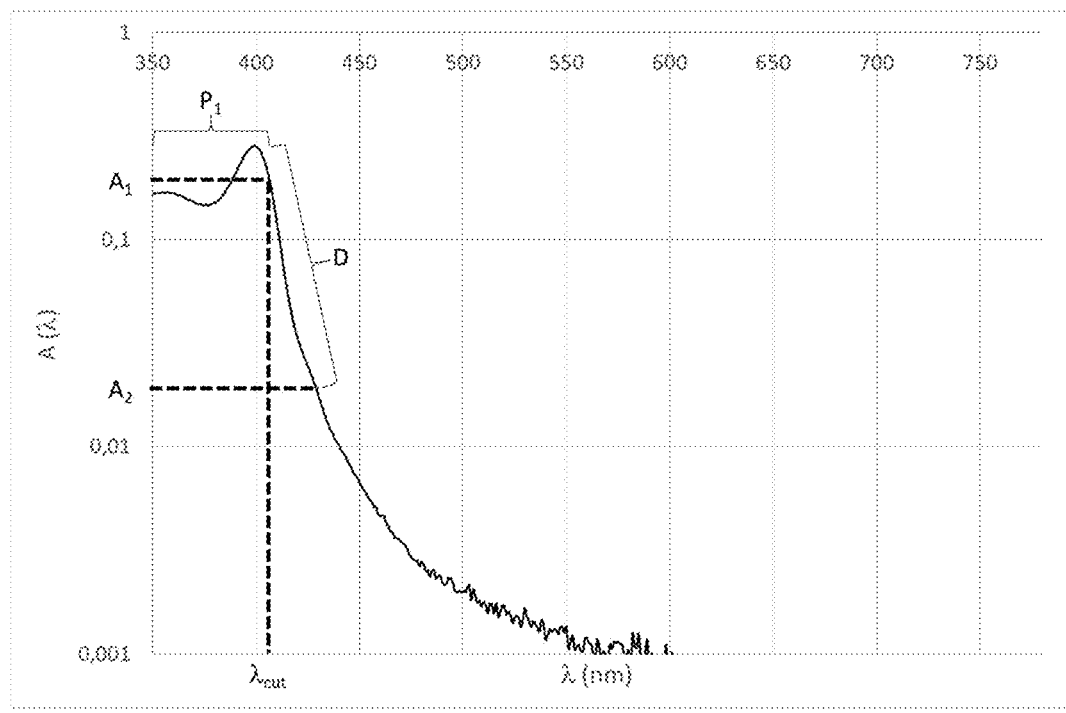
FIG. 3.1
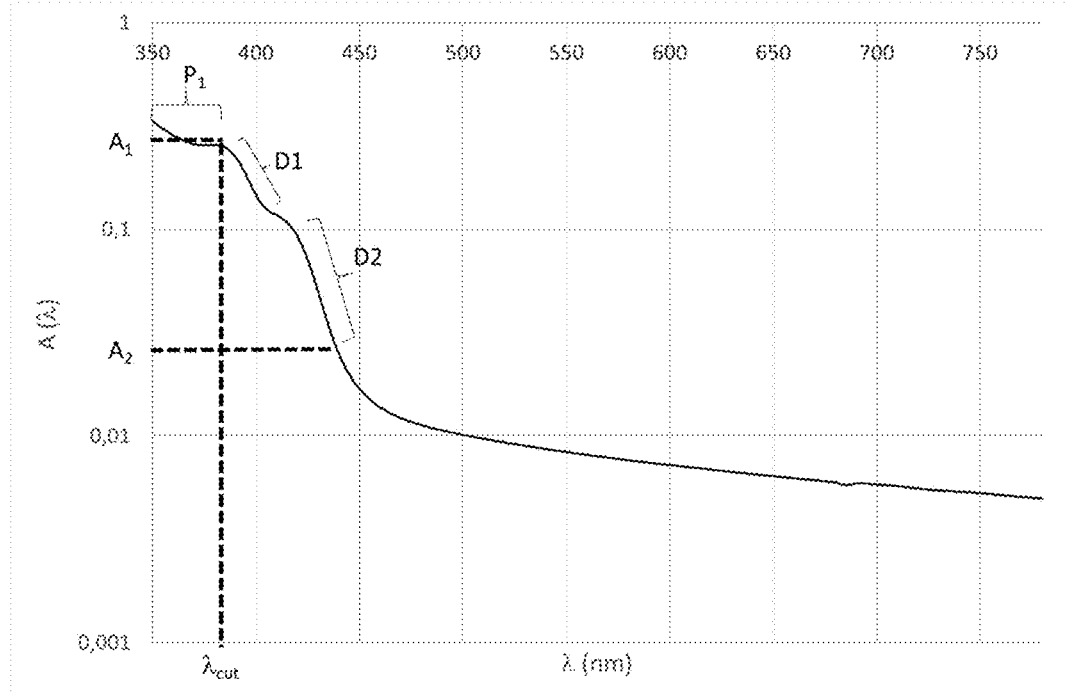
FIG. 3.2

BLUE FILTER FOR DISPLAY

FIELD

The present invention pertains to the field of displays. In particular, the invention relates to displays having a filter limiting emission of blue light of high energy without reducing gamut of display.

BACKGROUND

The electromagnetic spectrum covers a wide range of wavelengths, among which are wavelengths visible to the human eye often referred to as the visible spectrum, in a range from 380 nm to 780 nm. Some wavelengths of high energy of the electromagnetic spectrum including those of the visible spectrum have several effects on human eye.

Photobiology, which is the study of the biological effect of light, has established that a portion of the electromagnetic spectrum provides beneficial effects for good health, including visual perception and circadian functions. However, it has also established the importance of protecting the eyes against harmful radiation, such as ultraviolet (UV) rays and high energy visible rays known as blue light. Indeed, visible light, even of ordinary everyday intensity, may cause cumulative retinal damage or contribute to the retinal ageing and may be an aggravating factor in the development of early and late age-related maculopathy (ARM), such as Age-Related Macular Degeneration (AMD).

Blue light is present in natural light and emitted by artificial lightings, in particular by LED light sources. Indeed, to produce withe light with LEDs, several coloured light sources are combined, including generally a red LED, a green LED and a blue LED. In general, blue LED emit light mainly in a range of wavelength from 440 to 500 nm, with low emission below 440 nm. It has to be noted that human eye is almost not sensitive to light with wavelength below 440 nm. However, this high energy blue light of wavelength less than 440 nm may cause cumulative retinal damage.

It is thus desirable to limit emission of high energy blue light from displays.

Besides, the performance of a display is linked to colour reproduction: a good display should be able to reproduce all colours perceived by human eye, including blue. This performance is measured by the gamut, or colour gamut, of the display. Gamut is usually represented as a surface in the CIE 1931 colour space. In additive colour model, coulours obtainable from a set of three red, green and blue sources are represented as a triangle in CIE 1931 colour space, each source being a vertex of the triangle and the area of the triangle being the gamut of said red, green and blue sources.

In order to maximize the gamut of such sources, it is desirable to have blue source of low wavelength.

Finally, there is a need to balance emission spectrum of blue sources in displays to protect eyes against effects of blue light while maintaining a large gamut.

In this disclosure, an optimal balance is obtained with a light filtering layer comprising semi-conductive nanoparticles, with very selective filtering.

SUMMARY

This disclosure thus relates to a display comprising
i. an image producing system having a gamut $G_0$ defined in a color space;
ii. a light filtering layer comprising semi-conductive nanoparticles;

wherein the absorbance through said light filtering layer is greater than 0.25 for each light wavelength ranging from 350 nm to $\lambda_{cut}$, $\lambda_{cut}$ being in the range from 420 nm to 450 nm; and wherein the gamut $G_1$ of said image producing system with said filtering layer has an area greater than 90% of the area of gamut $G_0$ in said color space.

In an embodiment, the image producing system comprises a backlight unit, at least one polarizer, an active matrix, at least one layer of liquid crystals and a protective layer. In particular, the light filtering layer is a coating applied on the internal side of the protective layer.

In an embodiment, the image producing system comprises three light sources having different colours and a protective layer. In particular, the light filtering layer is a coating applied on the internal side of the protective layer.

In an embodiment, gamut G0 and gamut G1 are evaluated in the CIE Luv color space and the gamut G1 of said image producing system with said filtering layer has an area greater than 95% of the area of gamut G0 in said color space.

In an embodiment, gamut G0 and gamut G1 are evaluated in the CIE xyY color space and the gamut G1 of said image producing system with said filtering layer has an area greater than 95% of the area of gamut $G_0$ in said color space, preferably greater than 98%.

In an embodiment, the semi-conductive nanoparticles comprise a material of formula $$M_xQ_yE_zA_w \qquad (I),$$

wherein:
M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;
Q is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;
E is selected from the group consisting of O, S, Se, Te, C, N, P, As, Sb, F, Cl, Br, I, or a mixture thereof;
A is selected from the group consisting of O, S, Se, Te, C, N, P, As, Sb, F, Cl, Br, I, or a mixture thereof; and
x, y, z and w are independently a decimal number from 0 to 5; x, y, z and w are not simultaneously equal to 0; x and y are not simultaneously equal to 0; z and w may not be simultaneously equal to 0.

In an embodiment, the light filtering layer is composed of a matrix in which semi-conductive nanoparticles are dispersed.

In a particular embodiment, the matrix is a polymerizable composition comprising (meth)acrylics monomers or oligomers, epoxy monomers or oligomers, or mixture thereof.

In another particular embodiment, the matrix is a polymerizable composition comprising monomers or oligomers selected from metal alkoxides, alkoxysilanes, alkylalkoxysilanes, epoxysilanes, epoxyalkoxysilanes, and mixtures thereof.

In another particular embodiment, the matrix is a polymerizable composition and the amount of semi-conductive nanoparticles in the polymerizable composition is from 10 ppm to 10 wt %, based on the weight of the polymerizable composition.

In an embodiment, the semi-conductive nanoparticles are capped with an organic layer or encapsulated in an inorganic matrix.

BRIEF DESCRIPTION OF THE DRAWINGS

FIG. 3 shows the generic absorbance of a polymerizable composition or material comprising semi conductive nanoparticles (logarithm scale) as a function of wavelength of light from 350 nm to 780 nm (linear scale): A(λ) and the principle of determination of $\lambda_{cut}$.

DETAILED DESCRIPTION

In the present invention, the following terms have the following meanings:

"Absorbance" is the decimal logarithm of ratio $I_0/I$, where $I_0$ is the intensity of light incident on a sample and I is the intensity of light transmitted through said sample. In this disclosure, absorbance is measured for wavelengths in UV and visible range from 350 nm to 780 nm. For solid samples (coating), absorbance is measured for a 5-micrometer-thick sample. For liquid samples (solutions of absorbing compound), absorbance is measured in a 1-centimeter light path cuvette. Absorbance of 1 means that 9 out of 10 photons are absorbed by the sample. Absorbance of 0.3 means that 1 out of 2 photons is absorbed by the sample.

"Color space": refers to a model for representation of color perceived by observers. In this disclosure, color space is any of the system defined by the International Commission on Illumination (CIE). It may be CIE 1931 xyY colour space with associated CIE 1931 xy chromaticity diagram coordinates. It may be CIE Luv colour space with associated u', v' chromaticity diagram coordinates. It may be CIE L*a*b*colour space with associated a, b chromaticity diagram coordinates.

"Core/crown" refers to a heterostructure in which a central nanoparticle: the core, is surrounded by a band of material disposed on the periphery of the core: the crown.

"Core/shell" refers to a heterostructure in which a central nanoparticle: the core, is embedded by a layer of material disposed on the core: the shell. Two successive shells may be laid, yielding core/shell/shell heterostructure. Core and shell may have the same shape, for instance core is a nanosphere and shell is a layer of essentially constant thickness yielding a spherical core/shell nanoparticle. Core and shell may have different shapes, for instance a dot—a nanosphere or a nanocube or any other nanocluster—is provided as a core and shell is grown laterally around the core, yielding an heterostructure with shape of a nanoplate but comprising a dot inside the nanoplate: the latter is named dot in plate thereafter. In some embodiments, core and shell have different compositions. In other embodiments composition varies continuously from core to shell: there is no precise boundary between core and shell but properties in centre of the core are different from properties on the outer boundary of shell.

Figure 1:
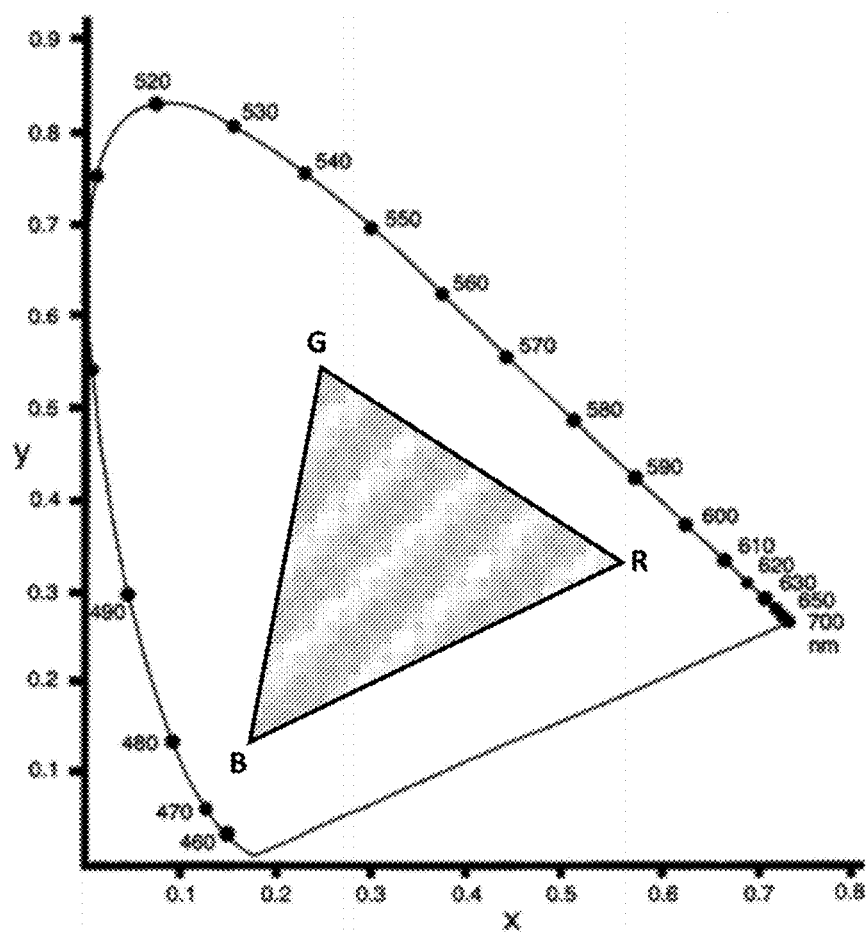
FIG. 1 is a graph showing a chromaticity space CIE xy, with the gamut defined from three light sources: red (R), green (G) and blue (B).

"Gamut" of a display: refers to the area of a color space, for example CIE 1931 xy chromaticity diagram, whose colours can be reproduced by said display. On FIG. 1, the curved edge represents the monochromatic colours, from 380 nm (blue) to 700 nm (red). A display suing three light sources red, green and blue with colour properties represented by points R, G and B in CIE 1931 xy chromaticity diagram has a gamut defined the triangle limited by vertices R, G and B. Same approach applies with other color spaces, as CIE Luv for instance.

"Nanometric size" refers to a size of matter in which quantum effects appear due to confinement. For semi-conductive nanoparticles, nanometric size has to be defined with the average Bohr radius of an electron/hole pair. Confinement is effective for size in at least one dimension of the object below 20 nm, preferably below 15 nm, more preferably below 10 nm. The stronger confinements are obtained with a size in at least one dimension below 5 nm.

"Nanoparticle" refers to a particle having a size in at least one of its dimensions below 100 nm. For a nanosphere, diameter should be below 100 nm. For a nanoplate, thickness should be below 100 nm. For a nanorod, diameter should be below 100 nm.

"Nanoplate" refers to a 2D shaped nanoparticle, wherein the smallest dimension of said nanoplate is smaller than the largest dimension of said nanoplate by a factor (aspect ratio) of at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5 or at least 10.

"Semi-conductive nanoparticles" refers to particles made of a material having an electronic structure corresponding to semi-conductive materials known in electronic industry but having a nanometric size. Due to their specific electronic structure, semi-conductive materials behave as high-pass absorbing materials. Indeed, light having a wavelength more energetic than band gap may be absorbed by the semi-conductive material, yielding an electron/hole pair, an exciton, which later recombine in the material and dissipate heat, or emit light, or both. On the contrary, light having a wavelength less energetic than band gap cannot be absorbed: semi-conductive material is transparent for these wavelengths. In macroscopic semi-conductive materials, visible light is generally absorbed while near/mid infra-red light is not absorbed. When semi-conductive particles have a nanometric size, confinement—i.e. shape and nanometric size—governs electronic structure following the rules of quantum mechanics and light absorption may be limited to UV range or UV and high energy visible light. Within this disclosure, semi-conductive nanoparticles absorb light having a wavelength below a threshold, this threshold being in the range of 350 nm—800 nm.

This disclosure relates to a display comprising an image producing system and a light filtering layer.

An image producing system is a light source configured to produce an image visible by human eye.

In an embodiment, said image is obtained by projection of light on a screen. In this embodiment, the image producing system comprises a light source, lenses for image projection and a screen. The light filtering layer may be located in any place on the light path: in the light source, as a layer between light source and lenses, or as a coating on lenses. This embodiment corresponds to projectors.

In another embodiment, said image is obtained by forming an array of pixels from a single light source, each pixel having a specific colour, thus forming a digital image. In this embodiment represented on FIG. 2, the image producing system 5 may comprise a light source 51, usually known as backlight unit, a polarizing layer 52, an active matrix 53, a layer of liquid crystal 54 and a protective layer 55. The active matrix is configured to define the array of pixels as well as their colour: a unique light source is used (either blue or white) and light emitted by this source is converted into green and red colours by fluorescence phenomenon. The liquid crystal layer is configured to control intensity of each pixel. The light filtering layer 6 may be located in any place on the light path: in the light source, as a layer between two successive components of the image producing system, or as a coating on any components of the image producing system. Preferably, the light filtering layer is a coating applied on the internal side of the protective layer 55. In this position, the light filtering layer is protected from environment and is the last (except protective layer) filter on the light path. In this last position, the amount of light incident on the light filtering layer is reduced as compared to a position on the backlight unit, thus the light filtering layer is less exposed to heat. This embodiment corresponds to LED displays.

In another embodiment, said image is obtained by forming an array of pixels, each pixel being a light source with a specific colour, thus forming a digital image. Usually, three colours are used as sources: red, green and blue, three pixels of different colours being mixed to form one pixel of desired colour obtained by addition. In this embodiment, intensity of each pixel may be adjusted separately. Light sources are protected by a protective layer. The light filtering layer may be located in any place on the light path: on the blue light sources only or on the protective layer. Preferably, the light filtering layer is a coating applied on the internal side of the protective layer. This embodiment corresponds to OLED or microLED displays.

In this disclosure, the image producing system has a gamut $G_0$ defined in a colour space. Any colour space is suitable to define gamut. Suitable colour spaces are CIE 1931 xyY and CIE Luv. The gamut $G_0$ is measured as an area in the colour space.

The light filtering layer is intended to limit emission of high energy blue light, so as to protect eyes of users. In order to do so, the light filtering layer herein disclosed has an absorbance greater than 0.25 for each light wavelength ranging from 350 nm to $\lambda_{cut}$, $\lambda_{cut}$ being in the range from 420 nm to 450 nm.

In an embodiment, absorbance is higher than 0.5, more preferably 1, even more preferably 1.5 for each light wavelength ranging from 350 nm to $\lambda_{cut}$.

The exact value of $\lambda_{cut}$ is determined according to the emission spectrum of light sources used in image producing system. Usually, $\lambda_{cut}$ is selected in the range from 420 nm to 450 nm. In particular, $\lambda_{cut}$ may be 425 nm, 430 nm, 435 nm, 440 nm or 445 nm.

FIG. 3.1 shows the generic absorbance curve of a light filtering layer as a function of wavelength of light from 350 nm to 780 nm: $A(\lambda)$. The absorbance curve presents three zones. In low wavelength area, i.e. in UV light and high energy visible light, absorbance is high and/or is roughly constant, defining a first plateau $P_1$ with an average absorbance $A_1$. After first plateau $P_1$, absorbance decreases sharply to reach a value $A_2$ of a tenth of $A_1$: $A_2=A_1/10$, thus defining a decreasing zone D. The limit between plateau $P_1$ and decreasing zone D defines the wavelength of transition $\lambda_{cut}$. After the decreasing zone D, absorbance may decrease and/or stabilize in a second plateau $P_2$, extending up to red end of visible light, namely 780 nm.

The width of decreasing zone D is generally less than 100 nm, preferably less than 50 nm, more preferably less than 40 nm, even preferably less than 30 nm.

While absorbance curves always have this generic shape, details vary with the nature of materials used and exact determination of $\lambda_{cut}$ may be difficult.

In some embodiments, absorbance curve shows a clear maximum at the limit of $P_1$, and D, as shown on FIG. 3.1. In this embodiment, $\lambda_{cut}$ may be defined by the following formula, where $\lambda_{cut}$ is in the decreasing zone D:

$$A(\lambda_{cut}) = \frac{\int_{350}^{\lambda_{cut}} A(\lambda) d\lambda}{\lambda_{cut} - 350}$$

In this embodiment, $\lambda_{cut}$ may be defined alternatively by the following formula for a local maximum:

$$\left.\frac{\partial \log A}{\partial \lambda}\right)_{\lambda_{cut}} = 0$$

In other embodiments, absorbance curve is monotonously decreasing slowly before decreasing sharply, as shown on FIG. 3.2. In this embodiment, $\lambda_{cut}$ may be defined by the lowest value of $\lambda$ where decrease of absorbance become significant in decreasing zone, for instance where:

$$\frac{\partial \log A}{\partial \lambda} < -0,01$$

The different determinations of $\lambda_{cut}$ proposed above give different but near values. In this disclosure, a value of $\lambda_{cut}$ has to be considered as a rounded value with uncertainty of ±5 nm.

The value of $\lambda_{cut}$ may be selected within the range of 420 nm to 450 nm by a proper selection of semi conductive nanoparticles composition, shape and structure.

In this disclosure, the image producing system with the light filtering layer has a gamut $G_1$ defined in the same colour space as for gamut $G_0$. In addition, the area of the gamut $G_1$ is greater than 90% of the area of the gamut $G_0$. Preferably, the area of the gamut $G_1$ is greater than 95% of the area of the gamut $G_0$.

In particular, when CIE xyY color space is used, the area of the gamut $G_1$ is greater than 90% of the area of the gamut $G_0$. Preferably, the area of the gamut $G_1$ is greater than 95% of the area of the gamut $G_0$. More preferably, the area of the gamut $G_1$ is greater than 98% of the area of the gamut $G_0$.

Alternatively, when CIE Luv color space is used, the area of the gamut $G_1$ is greater than 90% of the area of the gamut $G_0$. Preferably, the area of the gamut $G_1$ is greater than 95% of the area of the gamut $G_0$.

Figure 4:
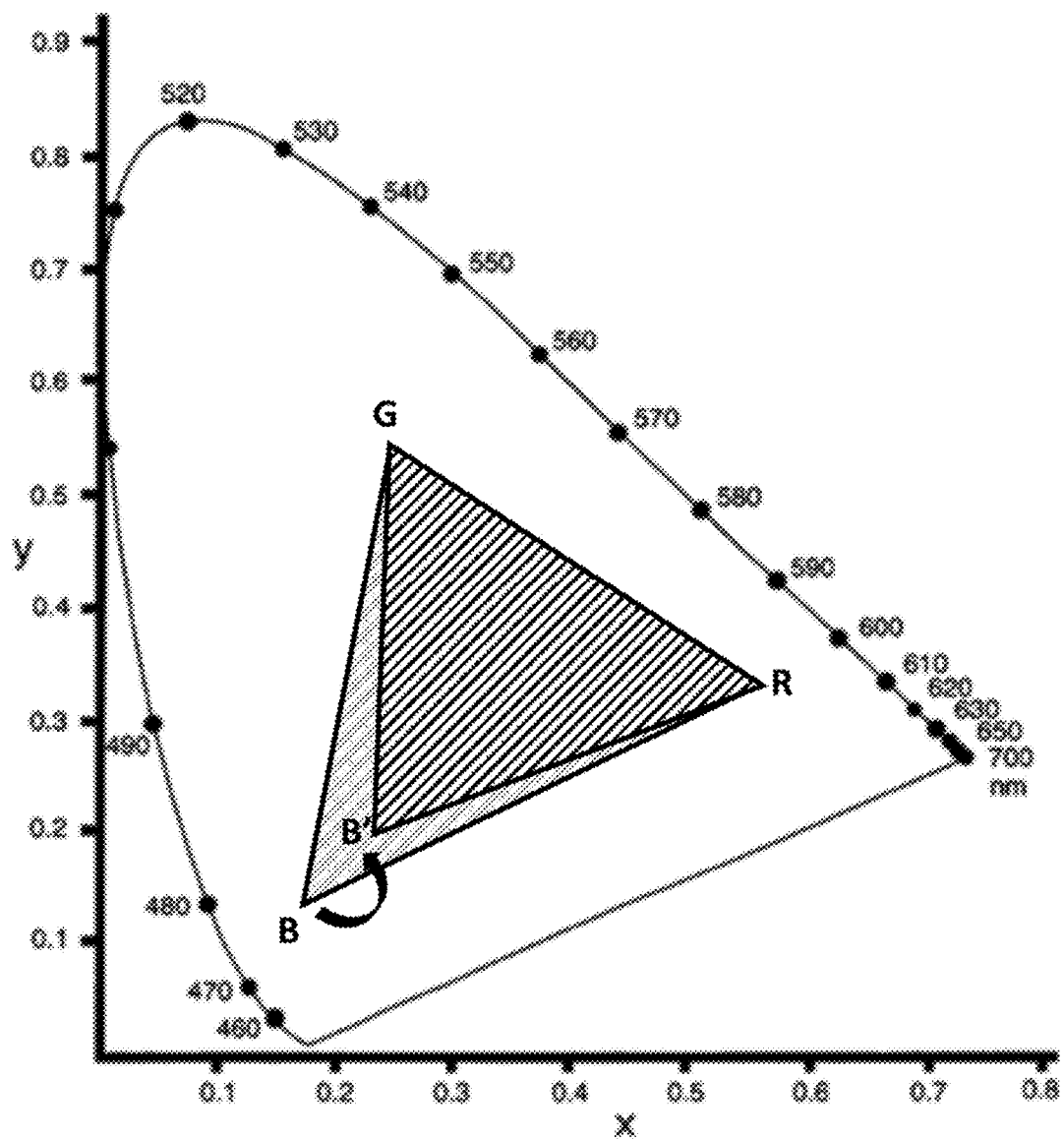
FIG. 4 is a graph showing a chromaticity space CIE xy, with the gamut defined from three light sources: red (R), green (G) and blue (B) without light filtering layer and with light filtering layer (blue source is shifted from B to B').

FIG. 4 shows the effect of light filtering layer on gamut of a display comprising three light sources (red, green and blue, identified by point R, G and B in CIE xy chromaticity diagram) in the image producing system. Light filtering layer has almost no effect on red and green sources as they emit at wavelength much larger than $\lambda_{cut}$. However, the position of blue source in chromaticity diagram is slightly changed by light filtering layer, as shown by the arrow, and located in B'. Indeed, light of highest energy (lowest wavelength) of the blue source is filtered out by the light filtering filter. Finally, area of gamut $G_0$ (without light filtering layer—light grey) is reduced to the area of gamut $G_1$ (hatched in solid black).

In this disclosure, the light filtering layer is a matrix comprising semi-conductive nanoparticles.

Matrix

Suitable matrix for the light filtering layer of the disclosure may be of any type, as soon as it is sufficiently transparent to visible light and allows for dispersion of the semi-conductive nanoparticles.

Suitable organic matrices are obtained from a polymerizable composition comprising at least one monomer or oligomer and at least one catalyst for initiating the polymerization of said monomer or oligomer.

Suitable monomers or oligomers are selected from allylic compounds, (meth)acrylic compounds, epoxy compounds, compounds used to prepare polyurethane or polythiourethane materials. Mixtures of these monomers, or multifunctional monomers—in particular epoxy-acrylic compounds—are also suitable. Besides, compounds used to prepare materials usually known as Sol-Gels are suitable.

In this disclosure, a (meth)acrylic monomer or (meth)acrylic oligomer is a compound comprising having acrylic or methacrylic groups. (Meth)acrylates may be monofunctional (meth)acrylates or multifunctional (meth)acrylates.

Suitable (meth)acrylic monomers or oligomers are multifunctional (meth)acrylates and may be selected from the group consisting of diacrylate, triacrylate, tetraacrylate and hexaacrylate monomers, such as pentaerythritol triacrylate or pentaerythritol tetraacrylate. In particular, the polyfunctional monomer is preferably selected from the group consisting of 1,4-butanedioldiacrylate, 1,6-hexanedioldiacrylate, dipropyleneglycol diacrylate pentaerythritol triacrylate, pentaerythritol tetraacrylate, dipentaerythritol tetraacrylate, dipentaerythritol hexaacrylate, silicone hexaacrylate, and mixtures thereof. The use of multifunctional acrylate monomers results in improved scratch resistance and better adhesion to thermoplastic substrates like PET or polycarbonate.

In an embodiment especially adapted for polymerization of (meth)acrylic monomers or oligomers, the catalyst meant for initiating polymerization is a free radical initiator. In a particular embodiment, catalyst is selected in the group consisting of a peroxodicarbonate, a peroxyester, a perketal, and mixtures thereof. In an alternative particular embodiment, catalyst is an azo compound selected from the group consisting of 2,2'-azobisisobutyronitrile, dimethyl 2,2'-azobis(2-methylpropionate), 2,2'-azobis(2-methylbutyronitrile), 2,2'-azobis(2,4-dimethylvaleronitrile), 4,4'-azobis(4-cyanopentanoic acid), and mixtures thereof.

Suitable epoxy monomers or oligomers are multifunctional epoxy and may be selected from the group consisting of diglycerol tetraglycidyl ether, dipentaerythritol tetraglycidyl ether, sorbitol polyglycidyl ether, polyglycerol polyglycidyl ether, pentaerythritol polyglycidyl ether such as pentaerythritol tetraglycidyl ether, trimethylolethane triglycidyl ether, trimethylolmethane triglycidyl ether, trimethylolpropane triglycidyl ether, triphenylolmethane triglycidyl ether, trisphenol triglycidyl ether, tetraphenylol ethane triglycidyl ether, tetraglycidyl ether of tetraphenylol ethane, p-aminophenol triglycidyl ether, 1,2,6-hexanetriol triglycidyl ether, glycerol triglycidyl ether, diglycerol triglycidyl ether, glycerol ethoxylate triglycidyl ether, Castor oil triglycidyl ether, propoxylated glycerine triglycidyl ether, ethylene glycol diglycidyl ether, 1,4-butanediol diglycidyl ether, neopentyl glycol diglycidyl ether, cyclohexanedimethanol diglycidyl ether, dipropylene glycol diglycidyl ether, polypropylene glycol diglycidyl ether, dibromoneopentyl glycol diglycidyl ether, hydrogenated bisphenol A diglycidyl ether, (3,4-epoxycyclohexane)methyl 3,4-epoxycylohexylcarboxylate and mixtures thereof. The use of such polyepoxides improves toughness of the resulting cured coating and adhesion to thermoset resin substrates.

In an embodiment especially adapted for polymerization of epoxy monomers or oligomers, the catalyst—often referred to as hardening agents—meant for initiating polymerization is selected from amines, anhydrides, phenols or thiols.

In this disclosure, mixture of monomers or oligomers having at least two isocyanate functions with monomers or oligomers having at least two alcohol, thiol or epithio functions are suitable polymerizable compositions.

Monomer or oligomer having at least two isocyanate functions may be selected from symmetric aromatic diisocyanate such as 2,2' Methylene diphenyl diisocyanate (2,2' MD I), 4,4' dibenzyl diisocyanate (4,4' DBDI), 2,6 toluene diisocyanate (2,6 TDI), xylylene diisocyanate (XDI), 4,4' Methylene diphenyl diisocyanate (4,4' MDI) or asymmetric aromatic diisocyanate such as 2,4' Methylene diphenyl diisocyanate (2,4' MDI), 2,4' dibenzyl diisocyanate (2,4' DBDI), 2,4 toluene diisocyanate (2,4 TDI) or alicyclic diisocyanates such as Isophorone diisocyanate (IPDI), 2,5 (or 2,6)-bis(iso-cyanatomethyl)-Bicyclo[2.2.1]heptane (NDI) or 4,4' Diisocyanato-methylenedicyclohexane (H12MD I) or aliphatic diisocyanates such as hexamethylene diisocyanate (HDI) or mixtures thereof.

Monomer or oligomer having thiol function may be selected from Pentaerythritol tetrakis mercaptopropionate, Pentaerythritol tetrakis mercaptoacetate, 4-Mercaptomethyl-3,6-dithia-1,8-octanedithiol, 4-mercaptomethyl-1,8-dimercapto-3,6-dithiaoctane, 2,5-dimerc aptomethyl-1,4-dithiane, 2,5-bis[(2-mercaptoethyl)thiomethyl]-1,4-dithiane, 4,8-dimercaptomethyl-1,1 1-dimercapto-3,6,9-trithiaundecane, 4,7-dimercaptomethyl-1,1 1-dimercapto-3,6,9-trithiaundecane, 5,7-dimercaptomethyl-1,1 1-dimercapto-3,6,9-trithiaundecane and mixture thereof.

Monomer or oligomer having epithio function may be selected from bis(2,3-epithiopropyl)sulfide, bis(2,3-epithiopropyl)disulfide and bis[4-(beta epithiopropylthio)phenyl]sulfide, bis[4-(beta-epithiopropyloxy)cyclohexyl]sulfide.

In an embodiment, the composition of the polymerizable composition yielding polyurethane or polythiourethane materials is stoichiometric, i.e. the number of isocyanate functions on monomers is substantially equal to the number of alcohol, thiol or epithio functions on monomers, so as to obtain a fully reticulated polymer.

In an embodiment especially adapted to compositions yielding polyurethane or polythiourethane materials, the catalyst meant for initiating polymerization is an organotin compound, and may be selected from dimethyltin chloride, dibutyltin chloride, and mixtures thereof.

In this disclosure, compounds used to prepare materials usually known as Sol-Gels are suitable. Monomers or oligomers may be selected from alkoxysilanes, alkylalkoxysilanes, epoxysilanes, epoxyalkoxysilanes, and mixtures thereof. These monomers or oligomers may be prepared in a solvent to form the polymerizable composition. Suitable solvents are polar solvents, such as water/alcohol mixtures.

Alkoxysilanes may be selected among compounds having the formula: $R_pSi(Z)_{4-p}$ in which the R groups, identical or different, represent monovalent organic groups linked to the silicon atom through a carbon atom, the Z groups are identical or different and represent hydrolyzable groups or hydrogen atoms, p is an integer ranging from 0 to 2. Suitable alkoxysilanes may be selected in the group consisting of tetraethoxysilane $Si(OC_2H_5)_4$ (TEOS), tetramethoxysilane $Si(OCH_3)_4$ (TMOS), tetra(n-propoxy)silane, tetra(i-propoxy)silane, tetra(n-butoxy)silane, tetra(sec-butoxy)silane or tetra(t-butoxy)silane.

Alkylalkoxysilanes may be selected among compounds having the formula: $R_nY_mSi(Z_1)_{4-n-m}$ in which the R groups, identical or different, represent monovalent organic groups linked to the silicon atom through a carbon atom, the Y groups, identical or different, represent monovalent organic groups linked to the silicon atom through a carbon atom, the Z groups are identical or different and represent hydrolyzable groups or hydrogen atoms, m and n are integers such that m is equal to 1 or 2 and n+m=1 or 2.

Epoxyalkoxysilanes may be selected among compounds having the formula: $R_nY_mSi(Z_1)_{4-n-m}$ in which the R groups, identical or different, represent monovalent organic groups linked to the silicon atom through a carbon atom, the Y groups, identical or different, represent monovalent organic groups linked to the silicon atom through a carbon atom and containing at least one epoxy function, the Z groups are identical or different and represent hydrolyzable groups or hydrogen atoms, m and n are integers such that m is equal to 1 or 2 and n+m=1 or 2.

Suitable epoxysilanes may be selected from the group consisting of glycidoxy methyl trimethoxysilane, glycidoxy methyl triethoxysilane, glycidoxy methyl tripropoxysilane, α-glycidoxy ethyl trimethoxysilane, α-glycidoxy ethyl triethoxysilane, β-glycidoxy ethyl trimethoxysilane, β-glycidoxy ethyl triethoxysilane, β-glycidoxy ethyl tripropoxysilane, α-glycidoxy propyl trimethoxysilane, α-glycidoxy propyl triethoxysilane, α-glycidoxy propyl tripropoxysilane, β-glycidoxy propyl trimethoxysilane, β-glycidoxy propyl triethoxysilane, β-glycidoxy propyl tripropoxysilane, γ-glycidoxy propyl trimethoxysilane, γ-glycidoxy propyl triethoxysilane, γ-glycidoxy propyl tripropoxysilane, 2-(3,4-epoxycyclohexyl)ethyltrimethoxysilane, 2-(3,4-epoxycyclohexyl)ethyltriethoxysilane.

In an embodiment especially adapted to compositions yielding Sol-Gel materials, the catalyst meant for initiating polymerization is a Lewis Acid. Carboxylates of metals such as zinc, titanium, zirconium, tin or magnesium; aluminum acetylacetonate $Al(AcAc)_3$, are suitable catalysts.

In an embodiment, the amount of alkoxysilanes is 0 to 90% by weight based on the theoretical dry extract of the polymerizable composition; the amount of alkyl alkoxysilanes is 20 to 90% by weight based on the theoretical dry extract of the polymerizable composition, the amount of catalyst is 0.1 to 5% by weight based on the theoretical dry extract of the polymerizable composition.

By the theoretical dry extract of the composition, it is meant the weight of the composition from which all solvent and volatile moieties released during polymerization, e.g. cleavable alkyl substitutes of alkylsilanes, are removed.

The amount of monomer or oligomer according to the present disclosure may be from 20 to 99% by weight, in particular from 50 to 99% by weight, more particularly from 80 to 98% by weight, even more particularly from 90 to 97% by weight, based on the theoretical dry extract of the polymerizable composition.

The amount of catalyst in the polymerizable composition according to the present disclosure may be from 0.5 to 5.0% by weight. For methacrylic and other monomers polymerizable by radical, addition or condensation process, the amount of catalyst in the polymerizable composition may be in particular from 0.25 to 2.5% by weight, more particularly from 0.5 to 2.0% by weight, based on the theoretical dry extract of the composition. For Sol-Gel polymerizable composition, the amount of catalyst in the polymerizable composition may be in particular from 0.75 to 2.5% by weight, more particularly from 0.5 to 1.5% by weight, based on the theoretical dry extract of the composition.

Semi-Conductive Nanoparticles

In this disclosure, the light filtering layer comprises semi-conductive nanoparticles.

Materials may have various compositions and structures. Among mineral materials, some are electrically conductive, for instance metals. Some are electrically insulating, such as silicon oxide or tin oxide. Of particular interest in this disclosure are materials made of semi-conductive materials, well known in electronic industry. Semi-conductive materials may have a macroscopic size. If semi-conductive materials have a nanometric size, their electronic and optical properties are modified.

In this disclosure, semi-conductive nanoparticles bring especially interesting light absorbing properties to light filtering layers. In particular, with proper selection of composition and structure of semi-conductive nanoparticles, light absorbers having a sharp transition between range of absorbed light (of high energy) and range of transmitted light (low energy) may be designed. Semi-conductive nanoparticles absorb light having a wavelength below a threshold $\gamma_{cut}$, this threshold being in the range of 420 nm-450 nm.

Composition

In one embodiment, the semi-conductive nanoparticles comprise a material of formula $$M_xQ_yE_zA_w \qquad (I),$$

in which M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; Q is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; and A is selected from the group consisting of O, S, Se, Te, C, N, P, As, Sb, F, Cl, Br, I, or a mixture thereof. x, y, z and w are independently a decimal number from 0 to 5; x, y, z and w are not simultaneously equal to 0; x and y are not simultaneously equal to 0; z and w may not be simultaneously equal to 0.

In particular, semi-conductive nanoparticles may comprise a material of formula MxEy, in which M is Zn, Cd, Hg, Cu, Ag, Al, Ga, In, Si, Ge, Pb, Sb or a mixture thereof; E is O, S, Se, Te, N, P, As or a mixture thereof. x and y are independently a decimal number from 0 to 5, with the proviso that x and y are not 0 at the same time.

In a specific embodiment, the semi-conductive nanoparticles comprise a material selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, $MoS_2$, PdS, Pd4S, $WS_2$, $CsPbCl_3$, $PbBr_3$, $CsPbBr_3$, $CH_3NH_3PbI_3$, $CH_3NH_3PbCl_3$, $CH_3NH_3PbBr_3$, $CsPbI_3$, $FAPbBr_3$ (where FA stands for formamidinium), or a mixture thereof.

Shape

In this disclosure, semi-conductive nanoparticles may have different shapes, provided that they present a nanometric size leading to confinement of exciton created in the nanoparticle.

Semi-conductive nanoparticles may have nanometric sizes in three dimensions, allowing confinement of excitons in all three spatial dimensions. Such nanoparticles are for instance nanocubes or nanospheres also known as nanodots 1 as shown on FIG. 5.

Semi-conductive nanoparticles may have a nanometric sizes in two dimensions, the third dimension being larger: excitons are confined in two spatial dimensions. Such nanoparticles are for instance nanorods, nanowires or nanorings.

Semi-conductive nanoparticles may have a nanometric size in one dimension, the other dimensions being larger: excitons are confined in one spatial dimension only. Such nanoparticles are for instance nanoplates 2 as shown on FIG. 5, nanosheets, nanoribbons or nanodisks.

The exact shape of semi-conductive particles defines confinement properties; then electronic and optical properties depending on composition of semi-conductive particle, in particular the band gap, then $\lambda_{cut}$. It has been also observed that nanoparticles with a nanometric size in one dimension, especially nanoplates, present a sharper decreasing zone as compared to nanoparticles with other shapes. Indeed, width of decreasing zone is enlarged if nanometric size of nanoparticles fluctuates around a mean value. When nanometric size is controlled in only one dimension, i.e. for nanoplates, by a strict number of atomic layers, thickness fluctuations are almost null and transition between absorbing and non-absorbing state is very sharp. This leads to particularly effective light filters. In addition, semi-conductive particle are mineral material able to withstand conditions in which organic light absorbers are degraded Structure In an embodiment, semi-conductive nanoparticles are homostructures. By homostructure, it is meant that the nanoparticle is homogenous and has the same local composition in all its volume.

In an alternative embodiment, semi-conductive nanoparticles are heterostructures. By heterostructure, it is meant that the nanoparticle is comprised of several sub-volumes, each sub-volume having a different composition from neighbouring sub-volumes. In a particular embodiment, all sub-volumes have a composition defined by formula (I) disclosed above, with different parameters, i.e., elemental composition and stoichiometry.

Figure 5:
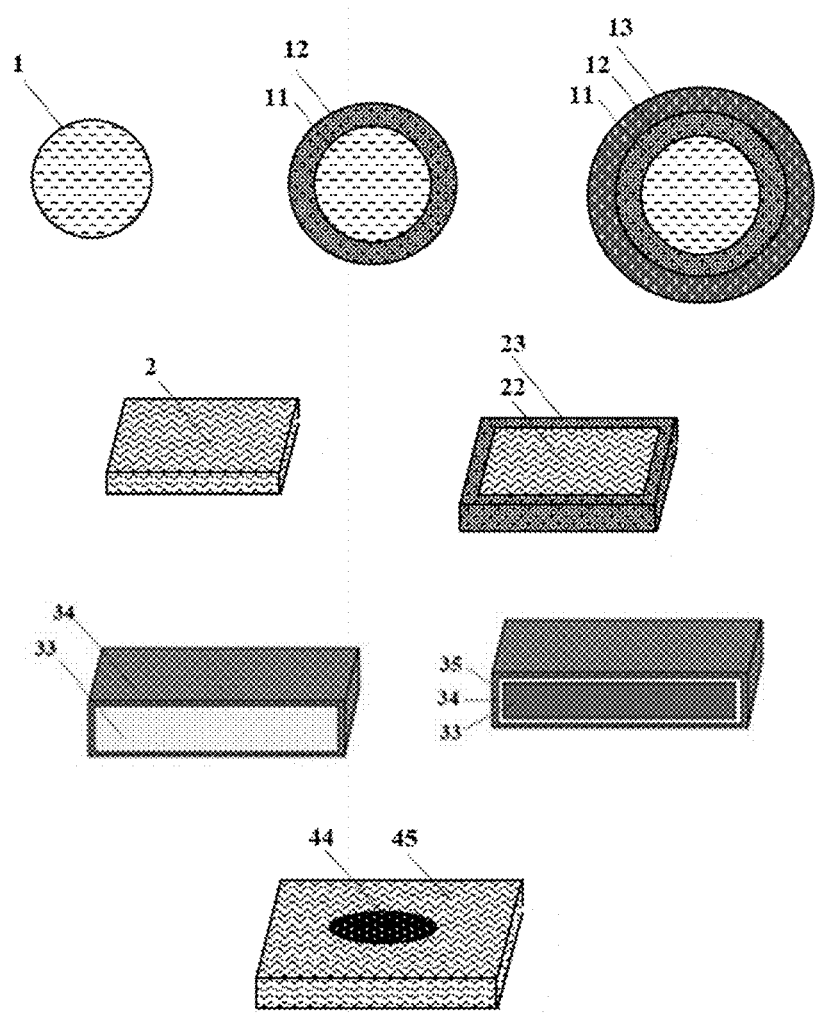
FIG. 5 is a schematic representation of various shapes (spheres and plates) and structure (homostructure, core/shell, core/crown, dot in plate) of semi-conductive nanoparticles.

Example of heterostructure are core/shell nanoparticles as shown on FIG. 5, the core having any shape disclosed above: nanosphere 11 or 44, nanoplate 33. A shell is a layer covering totally or partially the core: nanosphere 12, nanoplate 34 or 45. A particular example of core/shell heterostructure is a multi-layered structure comprising a core and several successive shells: nanospheres 12 and 13, nanoplates 34 and 35. For convenience, these multi-layered heterostructures are named core/shell hereafter. Core and shell may have the same shape—sphere 11 in sphere 12 for example—or not—dot 44 in plate 45 for instance.

Another example of heterostructure are core/crown nanoparticles as shown on FIG. 5, the core having any shape disclosed above. A crown 23 is a band of material disposed on the periphery of the core 22—here a nanoplate. This heterostructure is particularly useful with cores being nanoplates and crown disposed on the edges of the nanoplate.

FIG. 5 shows clear boundaries between core on one hand and shell or crown on the other hand. Heterostructures also enclose structures in which composition varies continuously from core to shell/crown: there is no precise boundary between core and shell/crown but properties in centre of the core are different from properties on the outer boundary of shell/crown.

In an advantageous embodiment, semi-conductive nanoparticles have a largest dimension below 500 nm, in particular below 300 nm, ideally below 200 nm. Semi-conductive nanoparticles of small size do not induce light scattering when dispersed in a material having a different refractive index.

Table 1 below discloses various semi-conducting nanoparticles suitable for use in this disclosure.

TABLE 1

| | Shape | Homo/Hetero structure | Dimensions (nm) | Composition - formula (I) | | | | $\lambda_{cut}$ (nm) |
|---|---|---|---|---|---|---|---|---|
| | | | | Mx | Qy | Ez | Aw | |
| 1 | Plate | Core(gradient)/Shell (Dot in Plate) | Core: gradient Shell: 1.2*15*15 | Cd 1 Cd 1 | — — | Se 0.5 | S 0.5 S 1 | 425 |
| 2 | Sphere | Homo | 7.1 | Zn 1 | — | Se 1 | — | 425 |
| 3 | Sphere | Homo | 7.4 | Zn 1 | — | Se 1 | — | 430 |
| 4 | Sphere | Homo | 7.7 | Zn 1 | — | Se 1 | — | 435 |
| 5 | Plate | Homo | 1.2*12*21 | Cd | | Se 0.5 | S 0.5 | 445 |

In an embodiment, semi-conductive nanoparticles are capped with organic compounds. By capped, it is meant that organic compounds are adsorbed or absorbed on the surface of the semi-conductive nanoparticle. Capping compounds provide several advantages. In particular, capping agent may behave as dispersing agents, avoiding semi-conductive nanoparticles agglomeration in polymerizable composition or during polymerization. Besides, capping agents may influence optical properties of semi-conductive nanoparticles as they modify boundary conditions of nanoparticles: but may be adjusted by selection of capping compounds.

Suitable capping compounds are ligands comprising at least one chemical moiety $M_A$ having an affinity to the surface of the semi-conductive nanoparticle, by any kind of intermolecular interactions.

In particular, $M_A$ may have an affinity for a metal element present at the surface of the semi-conductive nanoparticle. $M_A$ may be a thiol, a dithiol, an imidazole, a catechol, a pyridine, a pyrrole, a thiophene, a thiazole, a pyrazine, a carboxylic acid or carboxylate, a naphthyridine, a phosphine, a phosphine oxide, a phenol, a primary amine, a secondary amine, a tertiary amine, a quaternary amine or an aromatic amine.

Alternatively, $M_A$ may have an affinity for a non-metal element selected from the group of O, S, Se, Te, C, N, P, As, Sb, F, Cl, Br, I present at the surface of the semi-conductive nanoparticle. $M_A$ may be an imidazole, a pyridine, a pyrrole, a thiazole, a pyrazine, a naphthyridine, a phosphine, a phosphine oxide, a primary amine, a secondary amine, a tertiary amine, a quaternary amine or an aromatic amine.

Ligands may comprise several chemical moieties $M_A$, identical or different. Ligands may be a polymer having chemical moieties $M_A$, identical or different, as pending groups along the polymer backbone or repeated groups in the polymer backbone.

In an embodiment, semi-conductive nanoparticles are encapsulated within a matrix, forming capsules. By encapsulated, it is meant that semi-conductive nanoparticles are dispersed within an encapsulating material so that the encapsulating material covers all surface of semi-conductive nanoparticles. In other words, encapsulating material forms a barrier around semi-conductive nanoparticles. Such a barrier as several advantages. In particular, semi-conductive nanoparticles may be protected against chemicals, e.g. moisture, oxidants. Besides, semi-conductive nanoparticles that are not dispersible in a medium may be encapsulated in a material whose compatibility with said medium is good: the barrier behaves as a compatibilization agent. Last, encapsulated semi-conductive nanoparticles may be under the form of a powder dispersible in a medium instead of a dispersion in a solvent, thereby providing with easier handling in current processes.

Encapsulating material may be organic, in particular organic polymers. Suitable organic polymers are polyacrylates; polymethacrylates; polyacrylamides; polyamides; polyesters; polyethers; polyoelfins; polysaccharides; polyurethanes (or polycarbamates), polystyrenes; polyacrylonitrile-butadienestyrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); poly sulfone; polyethersulfone; polyethylenimine; polyphenylsulfone; poly(acrylonitrile styrene acrylate); polyepoxides, polythiophenes, polypyrroles; polyanilines; poly aryletherketones; polyfurans; polyimides; polyimidazoles; polyetherimides; polyketones; polynucleotides; poly-styrene sulfonates; polyetherimines; polyamic acid; or any combinations and/or derivatives and/or copolymers thereof.

Encapsulating material may be mineral, in particular mineral oxides or mixture of mineral oxides. Suitable mineral oxides are $SiO_2$, $Al_2O_3$, $TiO_2$, $ZrO_2$, FeO, ZnO, MgO, $SnO_2$, $Nb_2O_5$, $CeO_2$, BeO, $IrO_2$, CaO, $Sc_2O_3$, $Na_2O$, BaO, $K_2O$, $TeO_2$, MnO, $B_2O_3$, $GeO_2$, $As_2O_3$, $Ta_2O_5$, $Li_2O$, SrO, $Y_2O_3$, $HfO_2$, $MoO_2$, $Tc_2O_7$, $ReO_2$, $Co_3O_4$, OsO, $RhO_2$, $Rh_2O_3$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof. Preferred mineral encapsulating materials are $SiO_2$, $Al_2O_3$ and ZnO. In particular, nanoparticles comprising Zn may be encapsulated by $SiO_2$ or ZnO and nanoparticles comprising Cd may be encapsulated by $SiO_2$, $Al_2O_3$ or mixture of $SiO_2$ and $Al_2O_3$.

In an advantageous embodiment, capsules are nanoparticles, with a largest dimension below 500 nm, in particular below 300 nm, ideally below 200 nm. Capsules of small size do not induce light scattering when dispersed in a material having a different refractive index.

The amount of semi-conductive nanoparticles in a capsule according to the present disclosure may be from 1.0 to 90% by weight, in particular from 2.5 to 50% by weight, more particularly from 3.0 to 25% by weight, based on the total weight of the capsule.

The amount of semi-conductive nanoparticles in the polymerizable composition according to the present disclosure may be from 10 ppm to 1% by weight, in particular from 20 ppm to 0.5% by weight, more particularly from 25 ppm to 0.25% by weight, based on the theoretical dry extract of the composition. In this disclosure, the organic material that is used to cap semi-conductive nanoparticles or the material that is used to encapsulate semi-conductive nanoparticles is not included in the amount of semi-conductive nanoparticles. For the sake of clarity, a polymerizable composition comprising 1% weight, based on the theoretical dry extract of the composition, of aggregates comprising 30% weight of semi-conductive nanoparticles embedded in 70% weight of a mineral matrix, comprises 0.3% weight of semi-conductive nanoparticles, based on the theoretical dry extract of the composition.

In one embodiment, semi-conductive nanoparticles are uniformly dispersed in the polymerizable composition, i.e. each nanoparticle is separated from its nearest neighbour nanoparticle by at least 5 nm, preferably 10 nm, more preferably 20 nm, even more preferably 50 nm, most preferably 100 nm. In other words, semi-conductive nanoparticles are not aggregated in the polymerizable composition. Advantageously, the farther away the particles, the lower the diffusion.

In an embodiment, the semi-conductive nanoparticles comprised in the polymerizable composition have the same formula (I), shape and structure.

In another embodiment, the semi-conductive nanoparticles comprised in the polymerizable composition have different formula (I) and/or different shape and/or different structure. In this embodiment, absorbance of the polymerizable composition may be adjusted by superposition of absorbance of each type of semi-conductive nanoparticles, as taught by Beer-Lambert law.

In this embodiment, the decreasing zone of absorbance curve may be more complex, with a first decrease, then an intermediate plateau, then a second decrease as shown on FIG. 3.2. Hence, two decreasing zones $D_1$ and $D_2$ may be defined, each decreasing zone having a width of less than 100 nm, preferably less than 50 nm, more preferably less than 40 nm, even preferably less than 30 nm. Besides $A_2$ as defined above still apply and corresponds to two successive decreases.

More than two decreasing zones may be obtained and defined by analogy with the embodiment with two decreasing zones.

Absorbance of a light filtering layer is measured on a 5-micrometer-thick coating comprising semi-conductive nanoparticles. In an embodiment, absorbance is higher than 0.5, preferably 1, more preferably 1.5 for each light wavelength ranging from 350 nm to $\lambda_{cut}$. $\lambda_{cut}$ may be in the visible range, preferably in the range from 420 nm to 480 nm, preferably from 420 nm to 450 nm.

In one embodiment, absorbance of the polymerizable composition or absorbance of the light filtering layer has:
- a local maximum absorbance of highest wavelength in the range from 350 to 480 nm, said local maximum having an absorbance value $A_{max}$ for a wavelength $\lambda_{max}$,
- a value of 0.9 $A_{max}$ for a wavelength $\lambda_{0.9}$, $\lambda_{0.9}$ being greater than $\lambda_{max}$;
- a value of 0.5 $A_{max}$ for a wavelength $\lambda_{0.5}$, $\lambda_{0.5}$ being greater than $\lambda_{0.9}$; and
- wherein $|\lambda_{0.5} - \lambda_{0.9}|$ is less than 15 nm.

In a preferred configuration, $|\lambda_{0.5} - \lambda_{0.91}|$ is less than 10 nm, or less than 5 nm.

In an embodiment, absorbance of said light filtering material has a value of 0.1 $A_{max}$ for a wavelength $\lambda_{0.1}$, $\lambda_{0.1}$ being greater than $\lambda_{0.9}$; and wherein $|\lambda_{0.1} - \lambda_{0.9}|$ is less than 30 nm, preferably less than 20 nm, more preferably less than 15 nm.

Additives

The material of this disclosure may further comprise additives in conventional proportions. These additives include stabilizers such as antioxidants, UV light absorbers, light stabilizers, anti-yellowing agents, adhesion promoters. They should neither decrease the transparency of the material nor deteriorate optical properties of the semi-conductive nanoparticles.

EXAMPLES

The present invention is further illustrated by the following examples.

Light Filters

Light filtering layers have been prepared with ZnSe nanoparticles dispersed in a Sol-Gel coating.

ZnSe Semi-Conductive Nanoparticles

Semi-conductive nanoparticles of formula ZnSe (hereafter NP1) and having a shape of sphere with diameter of 7.1±0.2 nm were prepared according to procedure known by the man of the art and reported in *New J. Chem.*, 2007, 31, 1843-1852. Specific purification steps included selective precipitation and redispersion in presence of organic ligands as alkylamines A monodisperse population of ZnSe nanospheres was obtained with a coefficient of variation less than 20%.

Similar experiments were conducted to synthesize ZnSe nanosphere, respectively with a diameter of 7.4±0.2 nm (NP2) and 7.7±0.2 nm (NP3). The same purification steps were used to obtain monodisperse populations of ZnSe nanospheres with a coefficient of variation less than 20%.

Figure 6:
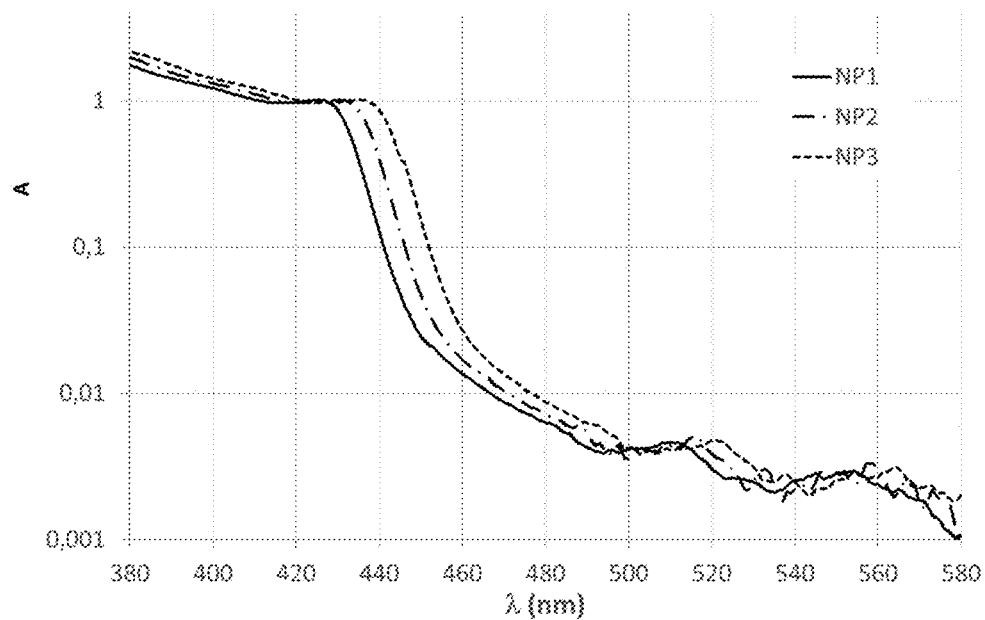
FIG. 6 shows Absorbance A of dispersion of nanoparticles NP1, NP2 and NP3 in heptane as a function of light wavelength (λ-in nm).

Absorbance curves of nanoparticles NP1, NP2 and NP3 in heptane were measured as a function of light wavelength in the UV-visible and are shown on FIG. 6 (logarithmic scale).

Characteristics of these nanoparticles are listed in Table 2 below:

TABLE 2

|  | ZnSe NP 1 | ZnSe NP 2 | ZnSe NP 3 |
|---|---|---|---|
| diameter (nm) | 7.1 ± 0.2 | 7.4 ± 0.2 | 7.7 ± 0.2 |
| $\lambda_{max}$ | 425 nm | 430 nm | 435 nm |
| $\lambda_{0.9}$ (at 0.9*$A_{max}$) | 429 nm | 434 nm | 440 nm |
| $\lambda_{0.5}$ (0.5*$A_{max}$) | 434 nm | 438 nm | 445 nm |
| $\lambda_{0.1}$ (0.1*$A_{max}$) | 441 nm | 447 nm | 453 nm |
| $|\lambda_{0.5} - \lambda_{0.9}|$ | 4 nm | 4 nm | 5 nm |
| $|\lambda_{0.1} - \lambda_{0.9}|$ | 12 nm | 13 nm | 13 nm |

Layer with ZnSe Semi-Conductive Nanoparticles 5 mL of a dispersion comprising ZnSe nanospheres NP1 were mixed with 5 mL of 3-mercaptoproprionic acid (MPA). This mixture was heated at 60° C. for 2 hours and then washed three times with absolute ethanol and toluene. ZnSe nanoparticles capped with MPA were redispersed in water at pH=10. These nanospheres were encapsulated according to the procedure disclosed in EP3630683 within a silica shell and redispersed in 0.5 mL of methanol. This dispersion D1 had a weight content of 2.5% of nanospheres. Same experiments were reproduced with semi-conductive nanoparticles NP2 and NP3 to prepare respectfully dispersion D2 and D3.

In addition, a Sol-Gel solution SG was also prepared in a separated vial with 100 μL of (3-Glycidyloxypropyl)trimethoxysilane, 65 μL of diethoxydimethylsilane and 35 μL of 0.1 M HCl. Solution SG was stirred for 24 hours at room temperature.

50 μL of dispersion D1 were added to 200 μL of solution SG to obtain a polymerizable composition then deposited by spin coating on a glass protective layer of a standard LCD display at 400 rpm during 30 s (dispensing step) then 2000 rpm during 2 min (spreading step). The resulting layer L1 was then heated at 150° C. for 6 h in order to obtain a condensed 5 μm thick Sol-Gel coating having a weight content in ZnSe nanospheres of 1% after curing. Same experiments were reproduced with dispersion D1 and D3 to prepare respectfully layer L2 and layer L3.

Figure 7:
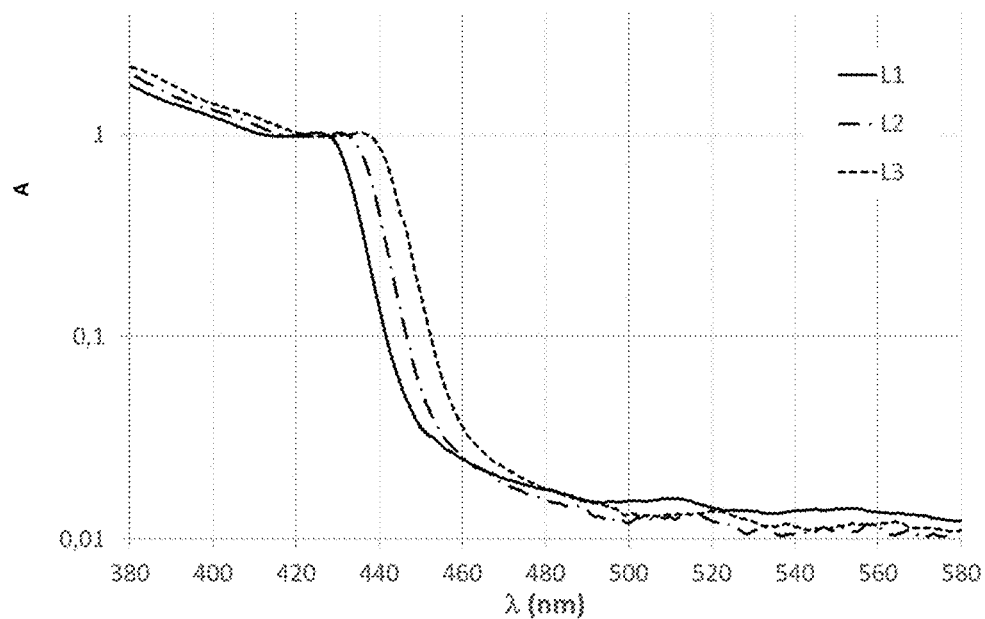
FIG. 7 shows Absorbance A of light filtering layers L1, L2 and L3 as a function of light wavelength (λ-in nm).

Absorbance curves of layers L1, L2 and L3 were measured as a function of light wavelength in the UV-visible and are shown on FIG. 7 (logarithmic scale). Thickness of layers L1, L2 and L3 were adjusted to have an absorbance equal to 1 at $\lambda_{cut}$.

Display with Light Filtering Layer

Figure 2:
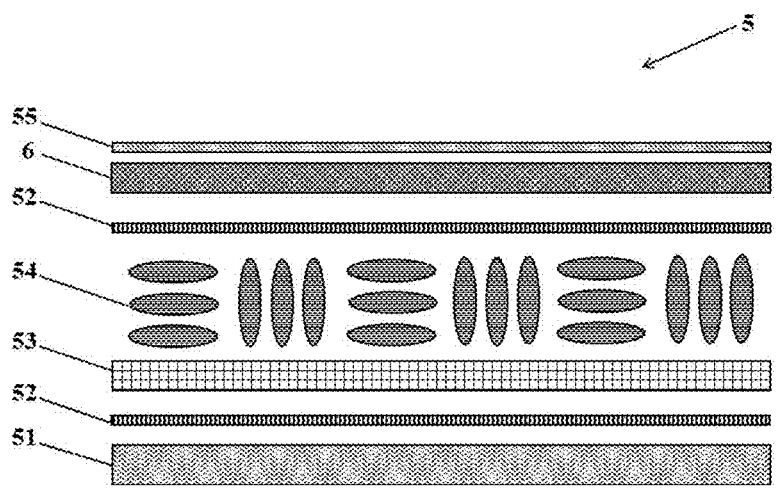
FIG. 2 illustrates a structure of a display apparatus as disclosed herein.

Layers L1, L2 and L3 (6) coated on the inner side of glass protective layer (55) were disposed in a display with a configuration shown on FIG. 2.

Figure 8:
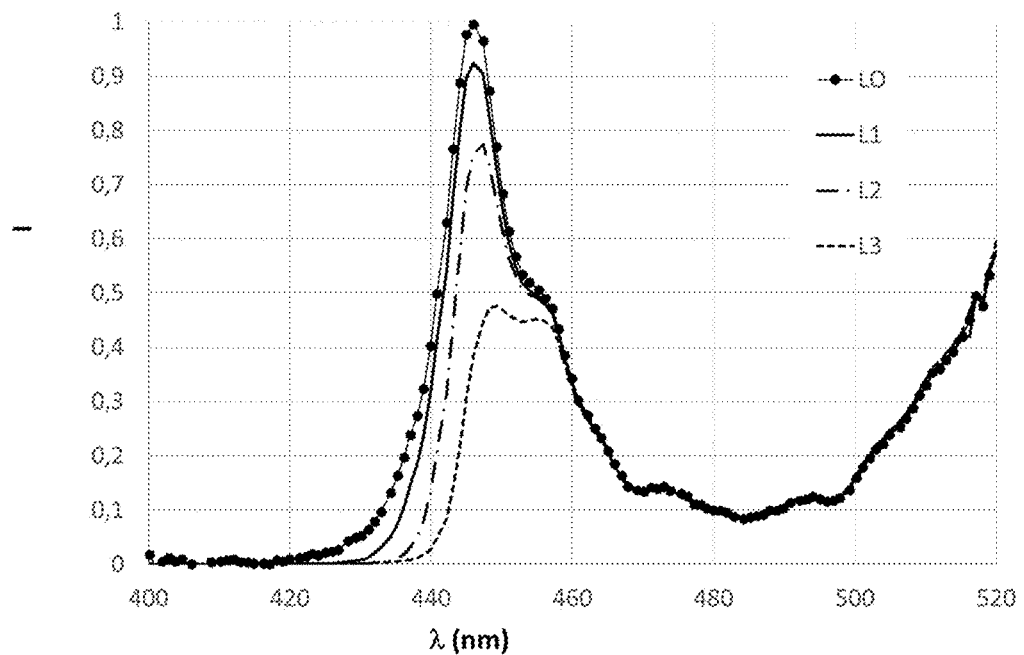
FIG. 8 shows intensity of light (I—in arbitrary unit) emitted by a blue LED as a function of light wavelength (λ-in nm) without light filtering layer (L0) and with light filtering layers L1, L2 and L3.

In this display, light sources of image producing system comprises blue LED. FIG. 8 shows intensity of light emitted by blue LED (I—in arbitrary unit) as a function of light wavelength (λ—in nm) without light filtering layer (L0) and with light filtering layers L1, L2 and L3.

High energy blue light emitted by blue LED is very efficiently filtered out with layers L1, L2 and L3. Indeed, light emitted corresponds to the area below intensity curve, and amount of light having a wavelength below 440 nm is dramatically decreased.

Table 3 below shows the amount of light filtered out for range of wavelength 400-440 nm (light to be filtered out) and range 440-500 nm (light to be maintained). Table 3 also shows the wavelength of maximum emission (nm). The characteristics of layers L1, L2 and L3 for $\lambda_{max}$, $\lambda_{0.9}$, $\lambda_{0.5}$ and $\lambda_{0.1}$ are the same as the characteristics of dispersion of nanoparticles listed in table 2: incorporation of nanoparticles in Sol-Gel coating didn't change absorbance features.

TABLE 3

|  | 400-440 nm (%) | 440-500 nm (%) | Peak (nm) |
|---|---|---|---|
| Layer L1 | 51 | 4.3 | 446 |
| Layer L2 | 87 | 13.6 | 447 |
| Layer L3 | 96 | 32 | 448 |

One can observe that layer L2 is a good compromise to filter out high energy blue light without changing too much the emission peak of blue light, in particular the wavelength of maximum emission is not shifted and remains at 454 nm.

Figure 9:
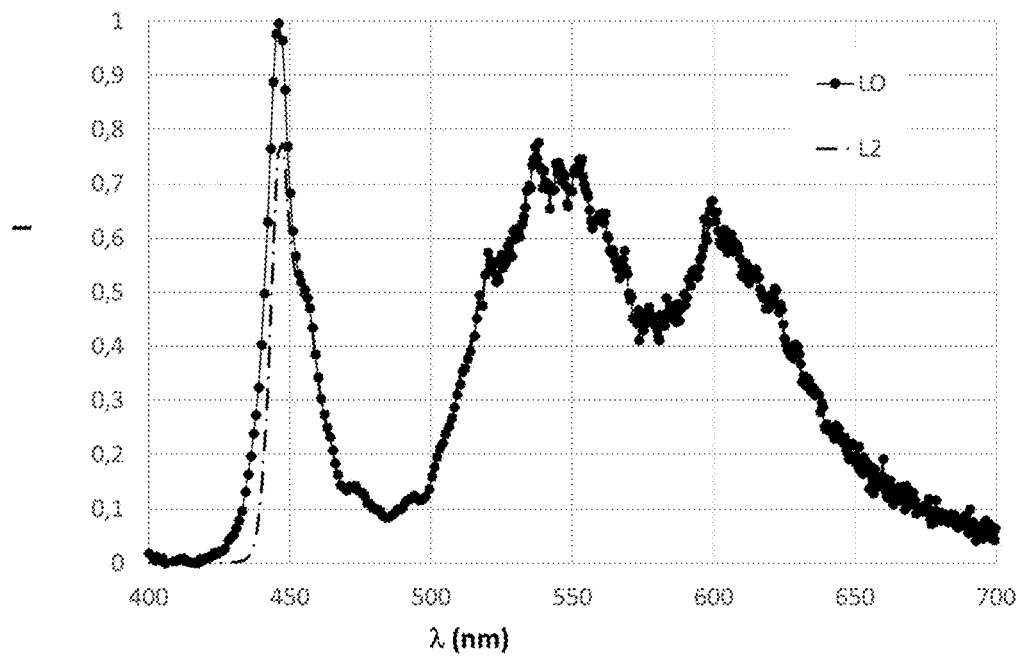
FIG. 9 shows intensity of white light (I—in arbitrary unit) emitted by a display as a function of light wavelength (λ-in nm) without light filtering layer (L0) and with light filtering layer L2.

In this display, fluorescent materials are used to produce green and red light, from blue light emitted by blue LED. FIG. 9 shows intensity of white light emitted by display (I—in arbitrary unit) as a function of light wavelength ($\lambda$—in nm) without light filtering layer (L0) and with light filtering layer L2.

Table 4 below shows coordinates of red, green, blue and white light emitted by this display, without light filtering layer (L0) and with light filtering layer L2, in the CIE Luv colour space. Taking for display without filter gamut $G_0$ equal to 100, the gamut $G_1$ of display with filter is 95.1.

TABLE 4

|  | No filter | Filter L2 |
|---|---|---|
| Blue | (0.15-0.05) | (0.15-0.06) |
| Green | (0.31-0.63) | (0.31-0.63) |
| Red | (0.65-0.35) | (0.65-0.35) |
| White point | (0.33-0.33) | (0.35-0.41) |

In the CIE xyY color space, taking for display without filter gamut $G_0$ equal to 100, the gamut $G_1$ of display with filter is 97.4.

With filter L2, colour of white light has been slightly changed. However, colour of white light in such displays is defined by intensity of the three sources (red, green and blue). It is thus straightforward to increase intensity of blue source to restore a white light with coordinates of (0.33, 0.33) in CIE Luv. This adjustment has no effect on gamut.

Finally, filtering layer L2 demonstrates a very efficient compromise: emission of high energy blue light by display is strongly limited and ability to produce colours over a wide range is maintained.

The invention claimed is:

1. A display comprising:
a) an image producing system having a gamut $G_0$ defined in a color space;
b) a light filtering layer comprising semi-conductive nanoparticles;
wherein an absorbance through said light filtering layer is greater than 0.25 for each light wavelength ranging from 350 nm to a wavelength of transition $\lambda_{cut}$, $\lambda_{cut}$ being in the range from 420 nm to 450 nm, such that an absorbance curve of the light filtering layer presents three zones:
a first plateau P1 wherein absorbance is high and is roughly constant to an average absorbance A1, corresponding to a low wavelength area,
a decreasing zone D wherein absorbance decreases from A1 to A2 and A2=A 1/10, a limit between the first plateau P1 and the decreasing zone D corresponds to the wavelength of transition $\lambda_{cut}$,
a second plateau P2 wherein absorbance is low and is roughly constant to an average absorbance A2, extending up to red end of visible light;
wherein a width of the decreasing zone D is less than 40 nm; and
wherein a gamut $G_1$ of said image producing system with said light filtering layer has an area greater than 90% of an area of gamut $G_0$ in said color space.

2. The display according to claim 1, wherein the image producing system comprises a backlight unit, at least one polarizer, an active matrix, at least one layer of liquid crystals and a protective layer.

3. The display according to claim 2, wherein the light filtering layer is a coating applied on an internal side of the protective layer.

4. The display according to claim 1, wherein the image producing system comprises three light sources having different colours and a protective layer.

5. The display according to claim 4, wherein the light filtering layer is a coating applied on an internal side of the protective layer.

6. The display according to claim 1, wherein gamut $G_0$ and gamut $G_1$ are evaluated in a CIE Luv color space and the gamut $G_1$ of said image producing system with said light filtering layer has an area greater than 95% of the area of gamut $G_0$ in said color space.

7. The display according to claim 1, wherein gamut $G_0$ and gamut $G_1$ are evaluated in a CIE xyY color space and the gamut $G_1$ of said image producing system with said light filtering layer has an area greater than 95% of the area of gamut $G_0$ in said color space.

8. The display according to claim 7, wherein gamut $G_0$ and gamut $G_1$ are evaluated in the CIE xyY color space and the gamut $G_1$ of said image producing system with said filtering layer has an area greater than 98% of the area of gamut $G_0$ in said color space.

9. The display according to claim 1, wherein the semi-conductive nanoparticles comprise a material of formula

$$M_xQ_yE_zA_w \qquad (I),$$

wherein:
M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;
Q is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof;
E is selected from the group consisting of O, S, Se, Te, C, N, P, As, Sb, F, Cl, Br, I, or a mixture thereof;
A is selected from the group consisting of O, S, Se, Te, C, N, P, As, Sb, F, Cl, Br, I, or a mixture thereof; and
x, y, z and w are independently a decimal number from 0 to 5; the sum of x, y, z and w is greater than 0; the sum of x and y is greater than 0; the sum of z and w is greater than 0.

10. The display according to claim 9, wherein a matrix is a polymerizable composition comprising (meth)acrylics monomers or oligomers, epoxy monomers or oligomers, or mixture thereof.

11. The display according to claim 9, wherein a matrix is a polymerizable composition comprising monomers or oligomers selected from the group consisting of metal alkoxides, alkoxysilanes, alkylalkoxysilanes, epoxysilanes, epoxyalkoxysilanes, and mixtures thereof.

12. The display according to claim 9, wherein a matrix is a polymerizable composition and an amount of semi-conductive nanoparticles in the polymerizable composition is from 10 ppm to 10 wt %, based on a weight of the polymerizable composition.

13. The display according to claim 1, wherein the light filtering layer is composed of a matrix in which the semi-conductive nanoparticles are dispersed.

14. The display according to claim 1, wherein the semi-conductive nanoparticles are capped with an organic layer or encapsulated in an inorganic matrix.

* * * * *